United States Patent
Kikuchi

(10) Patent No.: US 12,509,549 B2
(45) Date of Patent: Dec. 30, 2025

(54) RESIN COMPOSITION FOR LASER DIRECT STRUCTURING, MOLDED ARTICLE, AND, METHOD FOR MANUFACTURING PLATED MOLDED ARTICLE

(71) Applicant: MITSUBISHI CHEMICAL CORPORATION, Tokyo (JP)

(72) Inventor: Tatsuya Kikuchi, Hiratsuka (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 670 days.

(21) Appl. No.: 17/774,418

(22) PCT Filed: Nov. 4, 2020

(86) PCT No.: PCT/JP2020/041158
§ 371 (c)(1),
(2) Date: May 4, 2022

(87) PCT Pub. No.: WO2021/090824
PCT Pub. Date: May 14, 2021

(65) Prior Publication Data
US 2022/0372218 A1    Nov. 24, 2022

(30) Foreign Application Priority Data
Nov. 6, 2019   (JP) ................................. 2019-201276

(51) Int. Cl.
*C08G 64/04*        (2006.01)
*C08K 3/22*         (2006.01)
(Continued)

(52) U.S. Cl.
CPC ............... *C08G 64/04* (2013.01); *C08K 3/22* (2013.01); *C08K 7/14* (2013.01); *C08K 9/02* (2013.01);
(Continued)

(58) Field of Classification Search
CPC . C08G 64/04; C08K 3/22; C08K 7/14; C08K 9/02; C08K 2003/2231;
(Continued)

(56) References Cited

U.S. PATENT DOCUMENTS

2014/0147651 A1* 5/2014 Hitomi .................... B32B 27/08
                                                     428/220
2016/0108234 A1* 4/2016 Kikuchi ................... C08K 3/10
                                                     252/512

(Continued)

FOREIGN PATENT DOCUMENTS

EP    2 354 185 A1   8/2011
EP    2 740 598 B1   5/2016
(Continued)

OTHER PUBLICATIONS

Combined Chinese Office Action and Search Report issued Mar. 22, 2023, in corresponding Chinese Patent Application No. 202080075254.3 (with English Translation and English Translation of Category of Cited Documents), 11 pages.
(Continued)

*Primary Examiner* — Kelechi C Egwim
(74) *Attorney, Agent, or Firm* — Oblon, McClelland, Maier & Neustadt, L.L.P.

(57) ABSTRACT

Provided is a resin composition for laser direct structuring on which a plating can be formed and demonstrating low loss tangent, a molded article, and, a method for manufacturing a plated molded article. The resin composition for laser direct structuring contains a polycarbonate resin and a laser direct structuring additive, and the polycarbonate resin containing 5% by mass or more, relative to all structural units, of a structural unit represented by formula (1). In formula (1), each of $R^1$ and $R^2$ independently represents a
(Continued)

hydrogen atom or a methyl group, and $W^1$ represents a single bond or a divalent group).

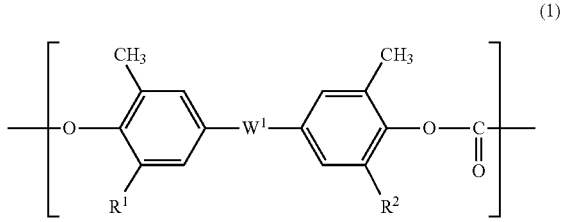

(1)

20 Claims, 1 Drawing Sheet

(51) Int. Cl.
C08K 7/14 (2006.01)
C08K 9/02 (2006.01)
H01Q 1/24 (2006.01)
H05K 1/03 (2006.01)

(52) U.S. Cl.
CPC .......... *H01Q 1/243* (2013.01); *H05K 1/0373* (2013.01); *C08K 2003/2231* (2013.01); *C08K 2003/2248* (2013.01); *C08K 2003/2251* (2013.01); *C08K 2201/001* (2013.01); *C08K 2201/014* (2013.01); *H05K 2203/107* (2013.01)

(58) Field of Classification Search
CPC .... C08K 2003/2248; C08K 2003/2251; C08K 2201/001; C08K 2201/014
USPC ........................................ 524/611
See application file for complete search history.

(56) References Cited

U.S. PATENT DOCUMENTS

2016/0130436 A1* 5/2016 Shouji .................. C23C 18/38
427/596
2019/0153216 A1 5/2019 Gong et al.

FOREIGN PATENT DOCUMENTS

| EP | 2 998 361 B1 | 7/2017 | |
| EP | 4 190 855 | 6/2023 | |
| JP | 8-183852 A | 7/1996 | |
| JP | 2000-503817 A | 3/2000 | |
| JP | 2004-534408 A | 11/2004 | |
| JP | 2013-18240 A | 1/2013 | |
| JP | 2014221850 A * | 11/2014 | ............... C08K 3/22 |
| JP | 2015-74676 A | 4/2015 | |
| JP | 2015074676 A * | 4/2015 | |
| JP | 2015108124 A * | 6/2015 | ............... C08K 3/22 |
| WO | WO 2009/141800 A2 | 11/2009 | |
| WO | WO 2012/128219 A1 | 9/2012 | |
| WO | WO 2013/018835 A1 | 2/2013 | |

OTHER PUBLICATIONS

Extended European Search Report issued May 11, 2023, issued in the corresponding European Patent Application No. 20885594.0, 7 pages.
International Search Report issued Dec. 28, 2020 in PCT/JP2020/041158 filed Nov. 4, 2020, 3 pages.
English translation of International Preliminary Report on Patentability and Written Opinion issued May 10, 2022 in PCT/JP2020/041158, 4 pages.
Chinese Office Action issued Aug. 17, 2023 in Chinese Application 202080075254.3 (with uneditied computer-generated English translation), 13 pages.
European Office Action issued Feb. 1, 2024 in European Application No. 20 885 594.0, 6 pgs.

* cited by examiner

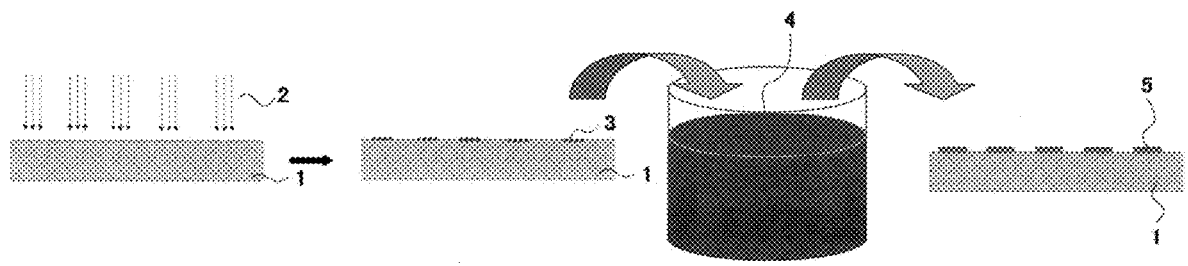

RESIN COMPOSITION FOR LASER DIRECT STRUCTURING, MOLDED ARTICLE, AND, METHOD FOR MANUFACTURING PLATED MOLDED ARTICLE

CROSS-REFERENCE TO RELATED APPLICATIONS

The present application is a 35 U.S.C. § 371 national stage application of International patent application PCT/JP2020/041158, filed Nov. 4, 2020, which is based on and claims the benefit of priority to Japanese Application No. 2019-201276, filed Nov. 6, 2019. The entire contents of these applications are incorporated herein by reference.

TECHNICAL FIELD

This invention relates to a resin composition for laser direct structuring, a molded article, and, a method for manufacturing a plated molded article, and particularly to an electronic/electric equipment component used with an electromagnetic wave at a frequency of 1 GHz or higher.

BACKGROUND ART

Keeping pace with development in mobile phones including smartphone, a variety of methods for fabricating antennas within the mobile phones have been investigated. In particular, there is a need for fabricating antennas with a three-dimensional design. Laser direct structuring (occasionally referred to as "LDS", hereinafter) technology has attracted public attention, as one known technology for fabricating such three-dimensional antenna. LDS is a technology for forming a plating layer, by irradiating laser on the surface of a molded article (resin molded article) that contains LDS additive, to thereby activate the irradiated area, and by applying a metal to the thus activated area. An advantage of the technology resides in capability of fabricating a metal structure such as antenna, directly onto the surface of a resin base, without using an adhesive or the like. The LDS technology is disclosed for example in Patent Literatures 1 to 4.

CITATION LIST

Patent Literature

[Patent Literature 1] JP 2000-503817 A
[Patent Literature 2] JP 2004-534408 A
[Patent Literature 3] WO2009/141800
[Patent Literature 4] WO2012/128219

SUMMARY OF THE INVENTION

Technical Problem

The resin molded article when manufactured by forming a metal structure such as antenna directly on the surface thereof, may be required to demonstrate small loss tangent, depending on applications.

It is therefore an object of this invention to solve such problem, and to provide a resin composition on which a plating can be formed and demonstrating low loss tangent, a molded article, and, a method for manufacturing a plated molded article.

Solution to Problem

The present inventors conducted research to address the above-mentioned problems, and as a result, discovered that the resin composition having low loss tangent, keeping excellent platability could be obtained by using polycarbonate resin containing a certain carbonate unit. Specifically, the problems described above are solved by the following means.

<1> A resin composition for laser direct structuring, the resin composition comprising a polycarbonate resin and a laser direct structuring additive, and
the polycarbonate resin containing 5% by mass or more, relative to all structural units, of a structural unit represented by formula (1),

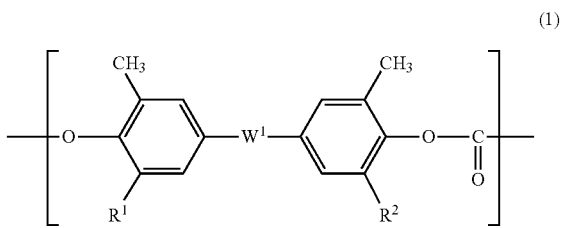

(in formula (1), each of $R^1$ and $R^2$ independently represents a hydrogen atom or a methyl group, and $W^1$ represents a single bond or a divalent group).

<2> The resin composition of <1>, wherein the laser direct structuring additive accounts for 0.1 parts by mass or more and 150 parts by mass or less, per 100 parts by mass of the polycarbonate resin.

<3> The resin composition of <1> or <2>, further comprising 10 parts by mass or more and 100 parts by mass or less of an inorganic filler, per 100 parts by mass of the polycarbonate resin.

<4> The resin composition of <3>, wherein the mass ratio of the structural unit represented by formula (1) in the polycarbonate resin, per 100 parts by mass of the inorganic filler, is 150 parts by mass or more.

<5> The resin composition of <3> or <4>, wherein the inorganic filler contains at least one selected from the group consisting of glass, talc, wollastonite, titanium oxide and boron nitride.

<6> The resin composition of <3> or <4>, wherein the inorganic filler contains a glass fiber.

<7> The resin composition of any one of <1> to <6>, wherein the polycarbonate resin further comprises a structural unit represented by formula (5),

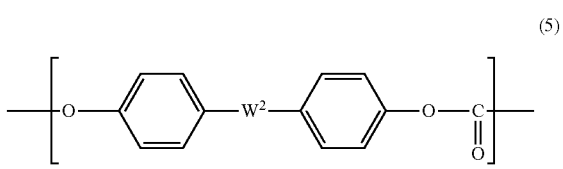

(in formula (5), $W^2$ represents a single bond or a divalent group).

<8> The resin composition of <7>, comprising a polycarbonate resin (A1) in which the structural unit represented by formula (1) accounts for 90% by mass of more of all structural units, and a polycarbonate resin (A2) in which the structural unit represented by formula (5) accounts for 90% by mass or more of all structural units, wherein the polycarbonate resin (A1) accounts for 25% by mass or more of the polycarbonate resin contained in the resin composition.

<9> The resin composition of <8>, wherein the polycarbonate resin (A1) has a viscosity average molecular weight of 16,000 or larger and 30,000 or smaller, and the polycarbonate resin (A2) has a viscosity average molecular weight of 16,000 or larger and 35,000 or smaller.

<10> The resin composition of any one of <1> to <9>, further comprising 2 parts by mass or more and 20 parts by mass or less of an impact modifier, per 100 parts by mass of the polycarbonate resin.

<11> The resin composition of any one of <1> to <10>, wherein a pencil hardness of "H" or larger, when formed into a flat plate and measured in compliance with JIS K5600.

<12> The resin composition of any one of claims 1 to 11, wherein a loss tangent is 0.0200 or smaller, when formed into a flat plate and measured at a frequency of 2.45 GHz.

<13> The resin composition of any one of <1> to <12>, wherein the laser direct structuring additive contains at least one selected from the group consisting of copper chromium oxide, oxide containing at least either antimony or phosphorus together with tin, and conductive oxide containing at least two kinds of metal and demonstrating a resistivity of $5 \times 10^3 \Omega \cdot cm$ or smaller.

<14> The resin composition of any one of <1> to <12>, wherein the laser direct structuring additive contains at least one selected from the group consisting of conductive oxide containing at least two kinds of metal and demonstrating a resistivity of $5 \times 10^3 \Omega \cdot cm$ or smaller.

<15> The resin composition of any one of <1> to <14>, wherein percentage of the structural unit represented by formula (1), relative to all structural units of the polycarbonate resin, is 30 to 60% by mass.

<16> The resin composition of any one of <1> to <15>, wherein content of the laser direct structuring additive, per 100 parts by mass of the polycarbonate resin, is 30 parts by mass or more and 150 parts by mass or less.

<17> The resin composition of any one of <1> to <16>, used for an electronic/electric equipment component used with an electromagnetic wave at a frequency of 1 GHz or higher.

<18> A molded article formed of the resin composition described in any one of <1> to <17>.

<19> The molded article of <18>, intended for an electronic/electric equipment component used with an electromagnetic wave at a frequency of 1 GHz or higher.

<20> The molded article of <18> or <19>, having a plating on a surface.

<21> The molded article of <20>, wherein the plating has antenna performance.

<22> A method for manufacturing a plated molded article, the method comprising forming a plating by irradiating a surface of the molded article described in any one of <1> to <17>, with a laser, and then by applying a metal.

<A> The resin composition according to any one of the aforementioned resin compositions, wherein $W^1$ in formula (1) is represented by formula (2a) described later.

<B> The resin composition according to any one of the aforementioned resin compositions, wherein the structural unit represented by formula (1) is represented by formula (3) described later.

<C> The resin composition according to any one of the aforementioned resin compositions, wherein the carbonate unit other than the structural unit represented by formula (1) is a structural unit represented by formula (5) described later, and $W^2$ is represented by formula (2a) described later.

<D> The resin composition according to any one of the aforementioned resin compositions, wherein the total content of the polycarbonate resin (A1) and the polycarbonate resin (A2) accounts for 90% by mass or more of the polycarbonate resin contained in the resin composition.

<E> The resin composition according to any one of the aforementioned resin compositions, containing no inorganic filler, and containing 80% by mass or more of the polycarbonate resin, in the resin composition.

<F> The resin composition according to any one of the aforementioned resin compositions, containing an inorganic filler, and containing 80% by mass or more, in total, of the polycarbonate resin and the inorganic filler, in the resin composition.

<G> The resin composition according to any one of the aforementioned resin compositions, containing an inorganic filler, and the inorganic filler containing a fiber-like material.

<H> The resin composition according to any one of the aforementioned resin compositions, containing 0.001 parts by mass or more and 1 part by mass or less of a heat stabilizer (preferably phosphorus-containing stabilizer, and more preferably tridecyl phosphite), per 100 parts by mass of the polycarbonate resin.

<I> The resin composition according to any one of the aforementioned resin compositions, containing 0.001 parts by mass or more and 1 part by mass or less of an antioxidant (preferably hindered phenol-based antioxidant, and more preferably octadecyl-3-(3,5-di-tert-butyl-4-hydroxyphenyl) propionate), per 100 parts by mass of the polycarbonate resin.

<J> The resin composition according to any one of the aforementioned resin compositions, containing 0.001 parts by mass or more and 2 parts by mass or less of a mold releasing agent (preferably ester formed between aliphatic acid and alcohol, and more preferably pentaerythritol tetrastearate), per 100 parts by mass of the polycarbonate resin.

<K> The resin composition according to any one of the aforementioned resin compositions, containing 2 parts by mass or more and 20 parts by mass or less of an elastomer (preferably a graft copolymer having a (meth)acrylate ester compound grafted to a rubber component, and more preferably a methyl methacrylate-butadiene copolymer which is a core/shell type graft copolymer) as an impact modifier, per 100 parts by mass of the polycarbonate resin.

<L> The resin composition according to any one of the aforementioned resin compositions, containing 98% by mass or more (more preferably 100% by mass), in total, of the polycarbonate resin, the LDS additive, the inorganic filler, as well as optionally added heat stabilizer, antioxidant, mold releasing agent, and elastomer.

<M> The resin composition according to any one of the aforementioned resin compositions, wherein the LDS additive contains at least one selected from the group consisting of oxide that contains antimony and tin, and a conductive oxide that contains at least two kinds of metal and demonstrates a resistivity of $5 \times 10^3 \Omega^- cm$ or smaller, containing Group n metal (n represents an integer of 3 to 16) and Group (n+1) metal in the periodic table.

Advantageous Effects of Invention

This invention enabled formation of the plating on the molded article, provision of the resin composition for laser direct structuring demonstrating low loss tangent, the molded article, and, the method for manufacturing the plated molded article.

BRIEF DESCRIPTION OF DRAWINGS

FIG. 1 A schematic drawing illustrating a step of providing a plating on a surface of a molded article.

DESCRIPTION OF EMBODIMENTS

This invention will be detailed below. Note that all numerical ranges given in this patent specification, using "to" preceded and succeeded by numerals, are used to represent the ranges including these numerals respectively as the lower and upper limit values.

In this patent specification, various physical values and characteristic values are those demonstrated at 23° C. unless otherwise specifically noted.

"Part(s) by mass" in this specification denotes relative quantity of each ingredient, meanwhile "% by mass" denotes absolute quantity of each ingredient.

The resin composition for laser direct structuring of this invention (may simply be referred to as "resin composition", hereinafter) specifically contains a polycarbonate resin and a laser direct structuring additive, and the polycarbonate resin contains 5% by mass or more, relative to all structural units, of a structural unit represented by formula (1).

With such structure, the molded article may have a plating formed thereon, and can achieve low loss tangent. The obtainable molded article may have an increased surface hardness.

This is presumably because the polycarbonate resin contains a specified ratio or more of the structural unit represented by formula (1), such as bisphenol C-derived structural unit.

<Polycarbonate Resin>

The resin composition of this invention contains a polycarbonate resin. The polycarbonate resin used in this invention contains the structural unit represented by formula (1) and the carbonate unit other than the structural unit represented by formula (1) (may be referred to as "other carbonate unit", hereinafter), wherein the mass ratio of the structural unit represented by formula (1) and the carbonate unit other than the structural unit represented by formula (1) is (33 to 100):(67 to 0).

<Polycarbonate Resin>

The resin composition of this invention contains a polycarbonate resin. In the polycarbonate resin used in this invention, the structural unit represented by formula (1) accounts for 5% by mass of more of all structural units.

In the polycarbonate resin used in this invention, the ratio of the structural unit represented by formula (1), in all structural units, is preferably 10% by mass or more, more preferably 20% by mass or more, even more preferably 25% by mass or more, yet more preferably 30% by mass or more, and even may be 35% by mass or more. Meanwhile, the upper limit of the ratio of the structural unit represented by formula (1) in all structural units may be 100% by mass, preferably 90% by mass or below, more preferably 80% by mass or below, even more preferably 70% by mass or below, yet more preferably 65% by mass or below, furthermore preferably 60% by mass or below, and even may be 55% by mass or below, or smaller than 50% by mass.

The polycarbonate resin may contain only one kind of the structural unit represented by formula (1), or may contain two or more kinds. When two or more kinds are contained, the total content preferably falls within any of the aforementioned ranges.

The polycarbonate resin used in this invention is usually composed of the structural unit represented by formula (1), the carbonate unit other than the structural unit represented by formula (1) (may occasionally be referred to as "other carbonate unit", hereinafter), and terminal groups. Such other carbonate unit may have a branched structure.

Contents of the structural unit represented by formula (1) and the other carbonate unit in this invention are defined relative to all structural units (100% by mass) but excluding both terminal groups.

Only one kind of such other carbonate unit may be contained in this invention, or two or more kinds may be contained. In a case where two or more kinds are contained, the total content preferably falls within any of the aforementioned ranges.

Next, the structural unit represented by formula (1) will be explained. The structural unit represented by formula (1) is as follows:

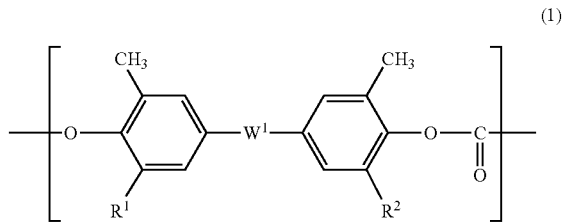

(1)

(in formula (1), each of $R^1$ and $R^2$ independently represents a hydrogen atom or a methyl group, and $W^1$ represents a single bond or a divalent group).

In formula (1), each of $R^1$ and $R^2$ independently represents a hydrogen atom or a methyl group. With each of $R^1$ and $R^2$ representing a hydrogen atom, the molded article of this invention will have further improved weatherability. With each of $R^1$ and $R^2$ representing a methyl group, the molded article of this invention will tend to have further improved heat resistance and moist heat stability. Hence, $R^1$ and $R^2$ are properly selectable depending on needs, wherein hydrogen atom is preferred.

In formula (1), $W^1$ represents a single bond or a divalent group. The divalent group is exemplified by oxygen atom, sulfur atom, divalent organic group, and combinations of them. The divalent organic group is preferred.

The divalent organic group is properly selectable from those previously known without special limitation, and is exemplified by the organic groups represented by formulae (2a) to (2h) below.

(2a)

(2b)

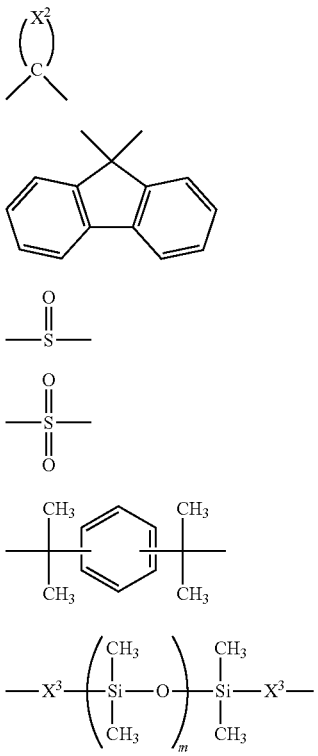

(2c)

(2d)

(2e)

(2f)

(2g)

(2h)

In formula (2a), each of $R^3$ and $R^4$ independently represents a hydrogen atom, a monovalent hydrocarbon group having 1 to 24 carbon atoms, or an alkoxy group having 1 to 24 carbon atoms, among which the monovalent hydrocarbon group having 1 to 24 carbon atoms is preferred.

The monovalent hydrocarbon group having 1 to 24 carbon atoms is exemplified by alkyl group having 1 to 24 carbon atoms, alkenyl group having 2 to 24 carbon atoms, optionally substituted aryl group having 6 to 24 carbon atoms, and arylalkyl group having 7 to 24 carbon atoms, wherein the alkyl group having 1 to 24 carbon atoms is preferred.

The alkyl group having 1 to 24 carbon atoms is exemplified by straight-chain or branched alkyl group, and alkyl group partially having a cyclic structure, among which the straight-chain alkyl group is preferred. The alkyl group having 1 to 24 carbon atoms is exemplified by methyl group, ethyl group, n-propyl group, n-butyl group, n-pentyl group, n-hexyl group, n-heptyl group, and n-octyl group, among which ethyl group is preferred.

The alkenyl group having 2 to 24 carbon atoms is exemplified by straight-chain or branched alkyl group, and alkenyl group partially having a cyclic structure, among which the straight-chain alkenyl group is preferred. The straight-chain alkenyl group having 2 to 24 carbon atoms is exemplified by vinyl group, n-propenyl group, n-butenyl group, n-pentenyl group, n-hexenyl group, n-heptenyl group, and n-octenyl group, among which vinyl group is preferred.

The aryl group having 6 to 24 carbon atoms is exemplified by those which may optionally be substituted by alkyl group or the like, such as phenyl group, naphthyl group, methylphenyl group, dimethylphenyl group, and trimethylphenyl group. The arylalkyl group having 7 to 24 carbon atoms is exemplified by benzyl group.

The alkenyl group having 1 to 24 carbon atoms is exemplified by straight-chain or branched alkyl group, and alkenyl group partially having a cyclic structure, among which the straight-chain alkenyl group is preferred. The straight-chain alkoxy group is exemplified by methoxy group, ethoxy group, propoxy group, and butoxy group.

In formula (2b), $X^1$ represents an oxygen atom or NRA. Now, $R^a$ is synonymous to the aforementioned $R^3$ and $R^4$.

In formula (2c), $X^2$ represents a divalent hydrocarbon group having 3 to 18 carbon atoms, and is typically exemplified by propylene group, butylene group, pentylene group, hexylene group, heptylene group, octylene group, nonylene group, decylene group, undecylene group, and dodecynylene group, each of them may further have a substituent. The substituent is exemplified by methyl group, ethyl group, propyl group, butyl group, pentyl group, and phenyl group. $X^2$ may have a crosslinked structure.

Formula (2c) is preferably given by formula (2i).

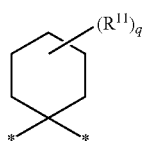

(2i)

In formula (2i), each $R^{11}$ independently represents a monovalent hydrocarbon group having 1 to 24 carbon atoms, or an alkoxy group having 1 to 24 carbon atoms. Details for the monovalent hydrocarbon group having 1 to 24 carbon atoms and the alkoxy group having 1 to 24 carbon atoms are same as that of $R^3$ in formula (2a).

q Represents an integer of 0 to 3, and is preferably 0.

* Represents a bonding site to which other group is bound.

In formula (2h), $X^3$ represents an alkylene group having 1 to 7 carbon atoms. The alkylene group may have a straight chain, branched chain, or cyclic structure, and is exemplified by methylene group, ethylene group, propylene group, and butylene group.

m Represents an integer of 1 to 500, which is preferably 5 to 300, and is more preferably 10 to 100.

A raw monomer of the structural unit represented by formula (1) is exemplified by those derived from aromatic dihydroxy compounds such as bis(4-hydroxy-3-methylphenyl)methane, bis(4-hydroxy-3,5-dimethylphenyl)methane, 1,1-bis(4-hydroxy-3-methylphenyl)ethane, 1,1-bis(4-hydroxy-3,5-dimethylphenyl)ethane, 2,2-bis(4-hydroxy-3-methylphenyl)propane, 2,2-bis(4-hydroxy-3,5-dimethylphenyl)propane, 2,2-bis(4-hydroxy-3-isopropylphenyl)propane, 2,2-bis(4-hydroxy-3-methylphenyl)butane, 2,2-bis(4-hydroxy-3,5-dimethylphenyl)butane, 1,3-bis(2-(4-hydroxy-3-methylphenyl)-2-propyl)benzene, 1,4-bis(2-(4-hydroxy-3-methylphenyl)-2-propyl)benzene, 1,1-bis(4-hydroxy-3-methylphenyl)cyclohexane, 1,1-bis(4-hydroxy-3,5-dimethylphenyl)cyclohexane, 1,1-bis(4-hydroxy-3-methylphenyl)-3,3,5-trimethylcyclohexane, 1,1-bis(4-hydroxy-3,5-dimethylphenyl)-3,3,5-trimethylcyclohexane, bis(4-hydroxy-3-methylphenyl)diphenylmethane, 9,9-bis(4-hydroxy-3-methylphenyl)fluorene, 9,9-bis(4-hydroxy-3,5-dimethylphenyl)fluorene, bis(4-hydroxy-3-methylphenyl)sulfone, 3,3-bis(4-hydroxy-3-methylphenyl)phthalide, 2-methyl-3,3'-bis(4-hydroxy-3-methylphenyl)phthalimidine, 2-phenyl-3,3'-bis(4-hydroxy-3-methylphenyl)phthalimidine, 4,4'-dihydroxy-3,3'-dimethylbiphenyl, and 4,4'-dihydroxy-3,3',5,5'-tetramethylbiphenyl.

The aromatic dihydroxy compound is more preferably 2,2-bis(4-hydroxy-3-methylphenyl)propane, 2,2-bis(4-hydroxy-3,5-dimethylphenyl)propane, 1,1-bis(4-hydroxy-3-methylphenyl)cyclohexane, or 1,1-bis(4-hydroxy-3-methylphenyl)-3,3,5-trimethylcyclohexane; more preferably 2,2-bis(4-hydroxy-3-methylphenyl)propane, or 2,2-bis(4-hydroxy-3,5-dimethylphenyl)propane; and even more preferably 2,2-bis(4-hydroxy-3-methylphenyl)propane.

That is, the structural unit represented by formula (1) is more preferably the structural units represented by formula (3), formula (4) and formula (4-2) below, even more preferably the structural unit represented by formula (3) or formula (4-2), and yet more preferably the structural unit represented by formula (3). With these structural unit contained therein, effects of this invention will be more efficiently demonstrated.

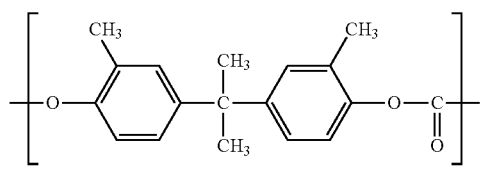
(3)

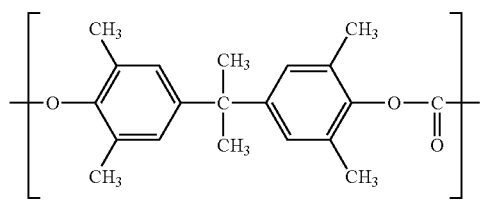
(4)

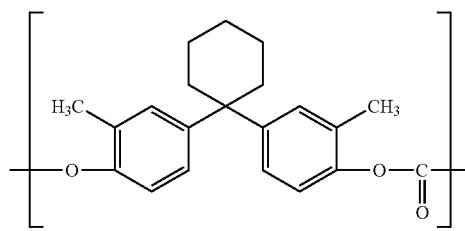
(4-2)

Next, the carbonate unit other than the structural unit represented by formula (1) will be explained.

Type of such other carbonate unit contained in the polycarbonate resin in this invention is not specifically limited, to which known carbonate units are widely applicable.

Such other carbonate unit is specifically exemplified by the structural units represented by formula (5) and formula (6) below, among them the structural unit represented by formula (5) is preferred. In particular, the structural unit represented by formula (5) preferably accounts for 90% by mass or more (preferably 95% by mass or more, and more preferably 99% by mass or more) of such other carbonate unit.

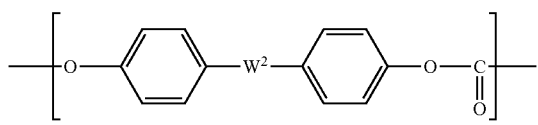
(5)

In formula (5), $W^2$ is synonymous to the aforementioned $W^1$, with equivalent preferred ranges. In particular, formula (2a) is preferred.

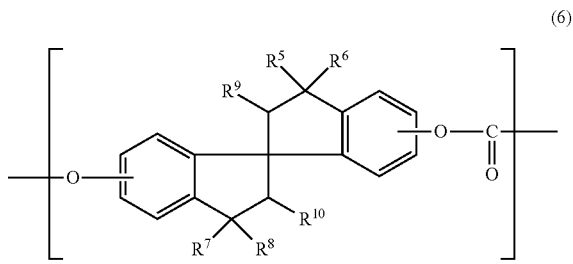
(6)

In formula (6), each of $R^5$, $R^6$, $R^7$, $R^8$, $R^9$ and $R^{10}$ independently represents at least one selected from hydrogen atom, and alkyl group having 1 to 6 carbon atoms. The alkyl group having 1 to 6 carbon atoms is exemplified by methyl group, ethyl group, and propyl group. In formula (6), each of $R^5$, $R^6$, $R^7$, and $R^8$ preferably represents an alkyl group having 1 to 6 carbon atoms, and more preferably represents a methyl group. Each of $R^9$ and $R^{10}$ preferably represents a hydrogen atom.

Such other carbonate unit is specifically exemplified by structural units derived from 2,2-bis(4-hydroxyphenyl)propane (bisphenol A), 2,2-bis(4-hydroxyphenyl)cyclohexane, 2,2-bis(4-hydroxyphenyl)-3,3,5-trimethylcyclohexane, and 6,6'-dihydroxy-3,3,3',3'-tetramethyl-1,1'-spiroindane.

Among them, 2,2-bis(4-hydroxyphenyl)propane (bisphenol A), and 6,6'-dihydroxy-3,3,3',3'-tetramethyl-1,1'-spiroindane are more preferred; and 2,2-bis(4-hydroxyphenyl)propane (bisphenol A) is even more preferred.

Next, specific examples of the polycarbonate resin in this invention will be explained. In this invention, the polycarbonate resins below are preferred:
(1) blend of polycarbonate resin (A1) and polycarbonate resin (A2);
(2) polycarbonate resin (A3);
(3) blend of polycarbonate resin (A1) and polycarbonate resin (A3);
(4) blend of polycarbonate resin (A2) and polycarbonate resin (A3);
(5) blend of polycarbonate resin (A1) and polycarbonate resin (A2) and polycarbonate resin (A3); and
(6) blend that contains more than 0% by mass up to 5% by mass or less of a polycarbonate resin other than the polycarbonate resin (A1) to polycarbonate resin (A3), in the aforementioned (1) to (5).

Now, the aforementioned polycarbonate resin (A1) to polycarbonate resin (A3) are as follows.

Polycarbonate Resin (A1):
polycarbonate resin in which the structural unit represented by formula (1) accounts for 90% by mass or more (preferably 95% by mass or more, and more preferably 99% by mass or more) of all structural units Polycarbonate Resin (A2):
polycarbonate resin in which the structural unit represented by formula (5) accounts for 90% by mass or more (preferably 95% by mass or more, and more preferably 99% by mass or more) of all structural units Polycarbonate Resin (A3):
polycarbonate resin in which the structural unit represented by formula (1) accounts for 1 to 99% by mass of all structural units, and the structural unit represented by formula (5) accounts for 99 to 1% by mass all structural unit A first embodiment of the polycarbonate resin in this invention contains the polycarbonate resin (A1) and the polycarbonate resin (A2), in which the polycarbonate resin (A1) accounts for 25% by mass or more of the polycarbonate resin contained in the resin composition.

In the first embodiment, the percentage of the polycarbonate resin (A1) in the polycarbonate resin contained in the resin composition is preferably 28% by mass or larger, and more preferably 30% by mass or larger. With the percentage controlled to any of these lower limit values or above, the loss tangent tends to be further lowered, and the surface hardness tends to further improve.

In the first embodiment, the percentage of the polycarbonate resin (A1) in the polycarbonate resin contained in the resin composition is preferably 100% by mass or smaller, more preferably 75% by mass or smaller, even more preferably 65% by mass or smaller, and yet more preferably 60% by mass or smaller. With the percentage controlled to such upper limit value or below, mechanical properties such as heat resistance and strength, required typically for enclosure of electronic/electric equipment, tend to further improve.

In the first embodiment, the total content of the polycarbonate resin (A1) and the polycarbonate resin (A2) is preferably 90% by mass or more of the polycarbonate resin contained in the resin composition, more preferably 95% by mass or more, even more preferably 99% by mass or more, and may even be 100% by mass.

A second embodiment of the polycarbonate resin in this invention relates to a polycarbonate resin that contains the polycarbonate resin (A3) in which the structural unit represented by formula (1) accounts for 1 to 99% by mass of the all structural unit, and the structural unit represented by formula (5) accounts for 99 to 1% by mass of all structural units, and the polycarbonate resin (A3) accounts for 40% by mass or more of the polycarbonate resin contained in the resin composition, wherein the percentage is preferably 50% by mass or more, more preferably 60% by mass or more, even more preferably 70% by mass or more, yet more preferably 80% by mass or more, furthermore preferably 90% by mass or more, and again further more preferably 99% by mass or more.

In the second embodiment, the percentage of the structural unit represented by formula (1) in the polycarbonate resin (A3) is preferably 25% by mass or larger, more preferably 30% by mass or larger, even more preferably 35% by mass or larger, yet more preferably 40% by mass or more, and further more preferably 50% by mass or more. With the percentage controlled to such lower limit value or above, the loss tangent tends to further decrease, and the pencil hardness tends to further improve. Meanwhile, the percentage of the structural unit represented by formula (1) in the polycarbonate resin (A3) is preferably 95% by mass or smaller, more preferably 90% by mass or smaller, even more preferably 80% by mass or smaller, yet more preferably 70% by mass or smaller, and furthermore preferably 60% by mass or smaller. With the percentage controlled to such upper limit value or below, the durability typically required for electronic/electric equipment component tends to further improve.

In the second embodiment, the percentage of the structural unit represented by formula (5) in the polycarbonate resin (A3) is preferably 25% by mass or larger, more preferably 30% by mass or larger, even more preferably 35% by mass or larger, yet more preferably 40% by mass or larger, and furthermore preferably 50% by mass or larger. With the percentage controlled to such lower limit value or above, the loss tangent tends to further decrease, and the pencil hardness tends to further improve. Meanwhile, the percentage of the structural unit represented by formula (1) in the polycarbonate resin (A3) is preferably 95% by mass or smaller, more preferably 90% by mass or smaller, even more preferably 80% by mass or smaller, yet more preferably 70% by mass or smaller, and furthermore preferably 60% by mass or smaller. With the percentage controlled to such upper limit value or below, the durability typically required for electronic/electric equipment component tends to further improve.

The polycarbonate resin contained in the resin composition of this invention may have viscosity-average molecular weight (for mixture, viscosity-average molecular weight of the mixture) which may properly be selectable without special limitation so long as the purpose of this invention will not be undermined. The viscosity-average molecular weight (Mv) converted from solution viscosity usually ranges from 10,000 to 50,000. The viscosity-average molecular weight (Mv) of the polycarbonate resin is preferably 11,000 or larger, more preferably 12,000 or larger, even more preferably 13,000 or larger, and particularly preferably 14,000 or larger. The viscosity-average molecular weight (Mv) of the polycarbonate resin is preferably 40,000 or smaller, more preferably 35,000 or smaller, even more preferably 30,000 or smaller, and particularly preferably 28,000 or smaller.

In this invention, the viscosity-average molecular weight of the polycarbonate resin (A1) is preferably 16,000 or larger and 30,000 or smaller. The viscosity-average molecular weight of the polycarbonate resin (A1) is preferably 17,000 or larger, meanwhile preferably 28,000 or smaller, and more preferably 26,000 or smaller.

The viscosity-average molecular weight of the polycarbonate resin (A2) is preferably 16,000 or larger and 35,000 or smaller. The viscosity-average molecular weight of the polycarbonate resin (A2) is preferably 18,000 or larger, and more preferably 20,000 or larger. The viscosity-average molecular weight of the polycarbonate resin (A1) is more preferably 30,000 or smaller, and yet more preferably 27,000 or smaller.

In this invention, it is particularly preferred that the aforementioned viscosity-average molecular weight is satisfied in the first embodiment of the polycarbonate resin (A1) and the polycarbonate resin (A2).

The viscosity-average molecular weight of the polycarbonate resin (A3) is preferably 10,000 or larger, and more preferably 15,000 or larger. Meanwhile, the viscosity-average molecular weight of the polycarbonate resin (A3) is preferably 35,000 or smaller, more preferably 30,000 or smaller, even more preferably 26,000 or smaller, and yet more preferably 24,000 or smaller.

In this invention, it is particularly preferred that the aforementioned viscosity-average molecular weight is satisfied in the second embodiment of the polycarbonate resin.

The viscosity-average molecular weight may be measured according to the description in EXAMPLES descried later.

A method for manufacturing the polycarbonate resin is properly selectable without special limitation from known techniques. The method for manufacturing the polycarbonate resin is exemplified by melt transesterification, interfacial polymerization, pyridine method, ring-opening polymerization of cyclic carbonate compound, and solid-phase transesterification of prepolymer. Among them, the melt transesterification and interfacial polymerization are preferred, and melt transesterification is more preferred.

The resin composition. of this invention, without inorganic filler contained therein, preferably contains 80% by mass or more in total of the polycarbonate resin and the LDS additive, wherein the total content is more preferably 85% by mass or more, more preferably 90% by mass or more, even more preferably 95% by mass or more, and may even be 98% by mass or more.

The resin composition of this invention, with inorganic filler contained therein, preferably contains 80% by mass or more in total of the polycarbonate resin, the IDS additive, and the inorganic filler, wherein the total content is more preferably 85% by mass or more, even more preferably 90% by mass or more, yet more preferably 95% by mass or more, and may even be 98% by mass or more.

In the resin composition of this invention, the total content of the LDS additive and the optionally-blended inorganic filler, per 100 parts by mass of the polycarbonate resin, is preferably 15 parts by mass or more, more preferably 30 parts by mass or more, even more preferably 60 parts by mass or more, yet more preferably 70 parts by mass or more, furthermore preferably 100 parts by mass or more, particularly preferably 120 parts by mass or more, and most preferably 140 parts by mass or more. With the total content controlled to any of the lower limit values or above, both of high permittivity and low loss tangent tends to be properly balanced, and further improved. Meanwhile, the total content of the LDS additive and the optionally-blended inorganic filler, per 100 parts by mass of the polycarbonate resin, is preferably 200 parts by mass or less, more preferably 180 parts by mass or less, and even more preferably 160 parts by mass or less. With the total content controlled to any of the upper limit values or below, both of strength and LDS performance, particularly required for electronic/electric equipment component, may further be improved.

Only one kind of the polycarbonate resin may be contained, or two or more kinds may be contained. In a case where two or more kinds are contained, the total content preferably falls within any of the aforementioned ranges.

<Laser Direct Structuring Additive>

The resin composition of this invention contains the laser direct structuring (LDS) additive.

The LDS additive in this invention means a compound that enables the polycarbonate resin to have a plating formed thereon, when 10 parts by mass of an additive expected to be the LDS additive is added to 100 parts by mass of the polycarbonate resin, the resin is then irradiated with YAG laser of 1064 nm wavelength at an output of 10 W, a frequency of 80 kHz, and a scanning speed of 3 m/s, and then subjected to electroless plating using an M-Copper 85 plating bath (from MacDermid Performance Solutions) so as to apply a metal to the laser-irradiated area. The LDS additive used in this invention may either be synthetic one or commercially available one. The commercially available one is not always necessarily be any of those marketed as the LDS additive, but may be a substance intended for other applications so long as it satisfies the requirement for the LDS additive in this invention. Only a single kind of the LDS additive may be used, or two or more kinds thereof may be used in a combined manner.

A first embodiment of the LDS additive used in this invention relates to copper chromium oxide. The LDS additive of the first embodiment preferably contains 10 to 30% by mass of copper, and 15 to 50% by mass of chromium.

Copper chromium oxide preferably has a spinel structure. The spinel structure is one of representative crystal structures found in $AB_2O_4$-type compound (A and B represent metal elements) that belongs to double oxide.

A first embodiment of the LDS additive (copper chromium oxide) may contain other trace metal. Such other metal is exemplified by antimony, tin, lead, indium, iron, cobalt, nickel, zinc, cadmium, silver, bismuth, arsenic, manganese, magnesium and calcium, among which manganese is preferred. These metals may exist in the form of oxide.

A preferred example of the LDS additive of the first embodiment is an LDS additive containing 10% by mass or less of a metal oxide other than copper chromium oxide.

A second embodiment of the LDS additive used in this invention relates to a metal oxide that contains at least one of antimony or phosphorus, together with tin, and is preferably a metal oxide that contains antimony and tin.

The second embodiment of the LDS additive is more preferably such that the tin content is larger than the phosphorus and antimony contents, and even more preferably such that the tin content accounts for 80% by mass or more of the total content of tin, and phosphorus and antimony.

In particular, the LDS additive of the second embodiment is preferably a metal oxide in which the tin content accounts for 80% by mass or more, relative to the total content of tin and antimony.

More specifically, the second embodiment of the LDS additive is exemplified by antimony-doped tin oxide, antimony oxide-doped tin oxide, phosphorus-doped tin oxide, and phosphorus oxide-doped tin oxide, among which antimony-doped tin oxide and antimony oxide-doped tin oxide are preferred, and antimony oxide-doped tin oxide is more preferred.

A third embodiment of the LDS additive used in this invention preferably contains a conductive oxide that contains at least two kinds of metal and has a resistivity of $5 \times 10^3$ Ω·cm or smaller. With use of the third embodiment of the LDS additive, high permittivity and low loss tangent tend to be properly balanced and improved. The conductive oxide preferably has a resistivity of $8 \times 10^2$ Ω·cm or smaller, more preferably $7 \times 10^2$ Ω·cm or smaller, and even more preferably $5 \times 10^2$ Ω·m or smaller. The lower limit may be, but not specifically limited to, $1 \times 10^1$ Ω·cm or above for example, -and further may be $1 \times 10^2$ Ω·cm or above.

The resistivity of the conductive oxide in this invention is typically given by powder resistivity, which can be measured by using a tester "Model 3223" from Yokogawa Electric Corporation, by placing 10 g of fine powder of the conductive oxide into a cylinder having an inner diameter of 25 mm, with an inner Teflon (registered trademark) lining, and then by pressurizing the powder at 100 kg/cm$^2$ (packing ratio=20%).

Although the LDS additive used in the third embodiment is not specifically limited so long as it contains the conductive oxide having a resistivity of $5 \times 10^3$ Ω·cm or smaller, it preferably contains at least two kinds of metal, and more preferably contains Group n (n is an integer of 3 to 16) metal and Group (n+1) metal in the periodic table. n Preferably represents an integer of 10 to 13, and more preferably 12 or 13. That is, one example of the LDS additive used in the third embodiment relates to a conductive oxide that contains aluminum and zinc, and having a resistivity of $5 \times 10^3$ Ω·cm or smaller.

In the LDS additive used in the third embodiment, assuming now the total content of the Group n (n is an integer of 3 to 16) metal and the Group (n+1) metal in the periodic table as 100 mol %, the content of either one metal is preferably 15 mol % or less, more preferably 12 mol % or less, and particularly 10 mol % or less. The lower limit is preferably, but not specially limited to, 0.0001 mol % or above. With the contents of two or more metals controlled within these ranges, the platability can be improved. In this invention, Group (n+1) metal-doped Group n metal oxide is particularly preferred.

Moreover, in the LDS additive used in the third embodiment, the Group n metal and the Group (n+1) metal in the periodic table preferably account for 98% by mass or more of metal component contained in the LDS additive.

The Group n metals in the periodic table are exemplified by those in Group 3 (scandium, yttrium), Group 4 (titanium, zirconium, etc.), Group 5 (vanadium, niobium, etc.), Group 6 (chromium, molybdenum, etc.), Group 7 (manganese, etc.), Group 8 (iron, ruthenium, etc.), Group 9 (cobalt, rhodium, iridium, etc.), Group 10 (nickel, palladium, platinum), Group 11 (copper, silver, gold, etc.), Group 12 (zinc, cadmium, etc.), Group 13 (aluminum, gallium, indium, etc.), Group 14 (germanium, tin, etc.), Group 15 (arsenic, antimony, etc.), and Group 16 (selenium, tellurium, etc.). Among them, Group 12 (n=12) metals are preferred, and zinc is more preferred.

The Group (nil) metals in the periodic table are exemplified by those in Group 4 (titanium, zirconium, etc.), Group 5 (vanadium, niobium, etc.), Group 6 (chromium, molybdenum, etc.), Group 7 (manganese, etc.), Group 8 (iron, ruthenium, etc.), Group 9 (cobalt, rhodium, iridium, etc.), Group 10 (nickel, palladium, platinum), Group 11 (copper, silver, gold, etc.), Group 12 (zinc, cadmium, etc.), Group 13 (aluminum, gallium, indium, etc.), Group 14 (germanium, tin, etc.), Group 15 (arsenic, antimony, etc.), and Group 16 (selenium, tellurium, etc.). Among them, metals in Group 13 (n+1=13) are preferred, aluminum or gallium is more preferred, and aluminum is even more preferred.

The LDS additive used in the third embodiment is preferably aluminum-doped zinc oxide.

The LDS additive used in the third embodiment may contain a metal other than the conductive metal oxide. The metal other than the conductive oxide is exemplified by antimony, titanium, indium, iron, cobalt, nickel, cadmium, silver, bismuth, arsenic, manganese, chromium, magnesium, and calcium. These metals may exist in the form of oxide. The content of each of these metals is preferably 0.01% by mass or less relative to the LDS additive.

The resin composition of this invention preferably contains 0.1 parts by mass or more and 150 parts by mass or less of the laser direct structuring additive, per 100 parts by mass of the polycarbonate resin. The content of the LDS additive, per 100 parts by mass of the polycarbonate resin, is preferably 1 part by mass or more, more preferably 3 parts by mass or more, even more preferably 5 parts by mass or more, yet more preferably 18 parts by mass or more, and even may be 30 parts by mass or more, and 40 parts by mass or more. With the content controlled to any of these lower limit values or above, the platability will more efficiently be demonstrated. In particular, with the content controlled to 30 parts by mass or more, both of high permittivity and low tangent loss may tend to be properly balanced and further improved. Meanwhile, the content of the LDS additive, per 100 parts by mass of the polycarbonate resin, is preferably 120 parts by mass or less, more preferably 100 parts by mass or less, even more preferably 80 parts by mass or less, yet more preferably 70 parts by mass or less, and furthermore preferably 69 parts by mass or less. With the content controlled to any of these upper limit values or below, the loss tangent may further be reduced.

The resin composition of this invention may contain one kind of the LDS additive, or two or more kinds. When two or more kinds are contained, the total content preferably falls within any of the aforementioned ranges.

<Inorganic Filler>

The resin composition of this invention may contain an inorganic filler, and preferably contains the inorganic filler. Note that the inorganic filler in this invention is defined to exclude those that fall within the category of LDS additive. With the inorganic filler contained therein, the obtainable molded article will have enhanced strength and rigidity. On the other hand, blending of the inorganic filler generally tends to increase loss tangent. This invention can, however, successfully achieve low loss tangent even if the inorganic filler is blended, by virtue of using of the polycarbonate resin that contains a certain amount of the structural unit represented by formula (1).

The inorganic filler is a substance that improves strength and/or rigidity of the resin component when contained therein, and may have any shape of fiber, plate, particle, or undefined shape, wherein fiber or plate shape is preferred. With use of fibrous or plate-like inorganic filler, only a relatively small amount of addition will successfully achieve high rigidity on the molded article. In particular, use of fibrous inorganic filler can successfully achieve high rigidity with a relatively small amount of addition.

The inorganic filler used in this invention preferably has a raw aspect ratio (aspect ratio before melt-kneaded) of 2 or larger, which is more preferably 3 or larger, and even may be 20 or larger, 100 or larger, 150 or larger, and 200 or larger. The upper limit of the aspect ratio is typically 400 or below, preferably 350 or below, more preferably 300 or below, and even may be 260 or below.

The inorganic filler used in this invention preferably keeps an aspect ratio of 2 or larger in pellet or the molded article, which is more preferably 3 or larger, and may even be 5 or larger, and 8 or larger. The upper limit of the aspect ratio is typically 100 or below, which is preferably 60 or below, more preferably 50 or below, and even may be 40 or below.

The aspect ratio is a number-average value of aspect ratios of 100 freely selected inorganic fillers. More specifically, the aspect ratio is calculated from measured values of the lengths of the inorganic fillers to be examined, randomly extracted from an image observed under an optical microscope. The magnification of observation is set to 20×. The same will apply to the number-average length and so forth described later.

The inorganic filler, if having the fibrous shape, typically includes glass fiber, carbon fiber, silica-alumina fiber, zirconia fiber, boron fiber, boron nitride fiber, silicon nitride-potassium titanate fiber, metal fiber, and wollastonite. The inorganic filler, if having the fibrous shape, is preferably glass fiber and wollastonite, and is more preferably glass fiber.

The inorganic filler, if having the fibrous shape, preferably has a cross-sectional shape of circle, ellipse, oval, rectangle, rectangle combined with semicircles arranged on both short sides, or cocoon, among which circular shape is preferred. The circular shape herein conceptually encompasses not only mathematical circle, but also those usually understood as circle in the technical field of this invention.

The inorganic filler, if having the fibrous shape, preferably has a number-average fiber length of 0.1 to 10 mm, which is more preferably 1 to 5 mm. With use of the fiber having such number-average fiber length, the resin molded article will have more improved mechanical strength. The lower limit of the number-average fiber diameter of the fiber is preferably 4.0 µm or above, more preferably 4.5 µm or above, and even more preferably 5.0 µm or above. The upper limit of the number-average fiber diameter of the fiber is preferably 15.0 µm or below, more preferably 14.0 µm or below, and even may be 12.0 µm or below. With use of the fiber having the number-average fiber diameter in this range, obtainable is a resin molded article that excels in platability even after gone through heat-moisture treatment. The resin molded article can keep excellent platability, even after stored for a long period, or after gone through heat-moisture treatment over a long time.

The fibrous inorganic filler is preferably glass fiber, and such glass fiber may be any of those obtainable by melt-spinning of commonly supplied glass such as E-glass (electrical glass), C-glass (chemical glass), A-glass (alkali glass), S-glass (high strength glass), or alkali resistant glass, without special limitation so long as it is obtainable in the form of glass fiber. The glass fiber in this invention preferably contains E-glass.

The glass fiber employed in this invention is preferably surface-treated with a surface treatment agent such as silane coupling agent which is exemplified by γ-methacryloxypropyl trimethoxysilane, γ-glycidoxypropyl trimethoxysilane, and γ-aminopropyl triethoxysilane. The amount of adhesion of the surface treatment agent is preferably 0.01 to 1% by mass of the glass fiber. Also applicable are glass fiber optionally coated with lubricant such as aliphatic acid amide compound or silicone oil; antistatic agent such as quaternary ammonium salt; film-forming resin such as epoxy resin or urethane resin; or mixture of film-forming resin with heat stabilizer, flame retardant or the like.

The glass fiber is commercially available. Commercially available product is exemplified by T-187, T-571, T-595, T-286H, T-756H and T-289H from Nippon Electric Glass Co., Ltd.; DEFT2A from Owwens Corning; HP3540 from PPG; and CSG3PA820 from Nitto Boseki Co., Ltd.

The inorganic filler, if not in fibrous shape, preferably has plate-like, particle-like, or undefined shape, wherein the plate-like shape is more preferred.

The plate-like inorganic filler functions to reduce the anisotropy and warpage, and is exemplified by glass flake, talc, mica, mica, kaolin, boron nitride, and metal foil. Talc and boron nitride are preferred as the plate-like inorganic filler.

The glass flake preferably has a number-average thickness of 0.5 to 20 µm, and a number-average length of 0.05 to 1.0 mm.

Other organic filler in the particle shape or undefined shape is exemplified by ceramic bead, glass bead, asbestos, clay, zeolite, potassium titanate, barium sulfate, titanium oxide, silicon oxide, aluminum oxide, and magnesium hydroxide.

The glass bead preferably has a number-average diameter of 5 to 100 µm.

One preferred embodiment of the inorganic filler in this invention is at least one selected from the group consisting of glass, talc, wollastonite, titanium oxide and boron nitride that accounts for 90% by mass or more (more preferably 95% by mass or more, even more preferably 97% by mass or more, and yet more preferably 99% by mass or more), which is preferably at least one selected from the group consisting of glass, talc and wollastonite, and is more preferably glass.

In particular in the embodiment of the inorganic filler, with use, as the LDS additive, of the conductive oxide that contains at least two kinds of the aforementioned metal, and having a resistivity of $5 \times 10^3$ Ω·cm or smaller, low loss tangent may be achieved in a more effective manner.

Regarding the inorganic filler besides those described above, descriptions in paragraphs [0029] to [0031] of JP-2019-172712A, and in paragraphs [0075] to [0079] of JP-2017-110180A may be referred to, the contents of which are incorporated by reference into this patent specification.

The content of the inorganic filler (preferably the total content of at least one selected from the group consisting of glass fiber, talc, and, boron nitride, and more preferably the content of the glass fiber), per 100 parts by mass of the polycarbonate resin, is preferably 10 parts by mass or more and 100 parts by mass or less. With the content controlled to the lower limit value or above, the obtainable electronic/electric equipment component will have more improved rigidity. Meanwhile, with the content controlled to the upper limit value or below, the workability during manufacture tends to further improve.

The lower limit value of the content of the inorganic filler is adjustable depending on applications, and may typically be 15 parts by mass or more, per 100 parts by mass of the polycarbonate resin. Meanwhile, the upper limit value of the content of the inorganic filler, per 100 parts by mass of the polycarbonate resin, is preferably 80 parts by mass or below, more preferably 60 parts by mass or below.

In the resin composition of this invention, the mass ratio of the structural unit represented by formula (1) in the polycarbonate resin, per 100 parts by mass of the inorganic filler, is preferably 150 parts by mass or larger. With the mass ratio controlled to 150 parts by mass or larger, it now becomes possible to keep the loss tangent low, while keeping the rigidity high. The mass ratio of the structural unit represented by formula (1) in the polycarbonate resin, per 100 parts by mass of the inorganic filler, is more preferably 100 parts by mass or larger, even more preferably 150 parts by mass or larger, yet more preferably 200 parts by mass or larger, furthermore preferably 300 parts by mass or larger, and again further more preferably 500 parts by mass or larger. Meanwhile, the upper limit value of the mass ratio of the structural unit represented by formula (1) in the polycarbonate resin, per 120 parts by mass of the inorganic filler, is more preferably 200 parts by mass or below, even more preferably 1500 parts by mass or below, yet more preferably 1000 parts by mass or below, furthermore preferably 800 parts by mass or below, and again further more preferably 600 parts by mass or below. With the mass ratio controlled to any of the upper limit values or below, both of rigidity and heat resistance, required for the electronic/electric equipment component, tend to be properly balanced, and improved.

The resin composition of this invention may contain only one kind of inorganic filler, or may contain two or more kinds. In a case where two or more kinds are contained, the total content preferably falls within any of the aforementioned ranges.

In the resin composition of this invention, the mass ratio of the inorganic filler and the LDS additive is usually 1:10 to 10:1, preferably 1:8 to 8:1, and more preferably 1:6 to 6:1. With the mass ratio controlled to any of these values, the strength and the LDS performance particularly required for the electronic/electric equipment component may properly be balanced, and more effectively be demonstrated.

<Other Ingredients>

The resin composition of this invention may optionally contain other ingredient other than the aforementioned ingredients, without undermining various desired physical characteristics.

Such other ingredient is exemplified by thermoplastic resin other than the polycarbonate resin, and various resin additives.

The thermoplastic resin other than the polycarbonate resin is exemplified by impact modifier; and styrene-based resin or polyester resin other than the impact modifier.

The resin additive is exemplified by dye, heat stabilizer, antioxidant, mold releasing agent, UV absorber, antistatic agent, flame retardant, flame retardant auxiliary, anticlouding agent, lubricant, antiblocking agent, flow improver, plasticizer, dispersion aid, and antibacterial agent. Only one kind of the resin additive may be contained, or two or more kinds may be freely combined according to freely selectable ratio.

«Impact Modifier»

The resin composition of this invention preferably contains an impact modifier. The impact modifier is preferably an elastomer, and the elastomer is preferably a graft copolymer formed by graft copolymerization of a rubber component and a monomer component co-polymerizable therewith.

Method for manufacturing the graft copolymer may be any of bulk polymerization, solution polymerization, suspension polymerization, and emulsion polymerization. Mode of copolymerization may be single-stage grafting or multi-stage grafting.

The rubber component preferably has a glass transition temperature of 0° C. or lower, which is preferably −20° C. or lower, and more preferably −30° C. or lower. The rubber component is specifically exemplified by polybutadiene rubber; polyisoprene rubber; polyalkyl acrylate rubber such as polybutyl acrylate, poly(2-ethylhexyl acrylate), and butyl acrylate/2-ethylhexyl acrylate copolymer; silicone-based rubber such as polyorganosiloxane rubber; butadiene-acryl composite rubber; IPN (interpenetrating polymer network)-type composite rubber composed of polyorganosiloxane rubber and polyalkyl acrylate rubber; styrene-butadiene rubber; ethylene-α-olefin-based rubber such as ethylene-propylene rubber, ethylene-butene rubber, and ethylene-octene rubber; ethylene-acryl rubber; and fluorine-containing rubber. These compounds may be used singly, or in the form of mixture of two or more kinds. Among them, preferred are polybutadiene rubber, polyalkyl acrylate rubber, polyorganosiloxane rubber, IPN-type composite rubber composed of polyorganosiloxane rubber and polyalkyl acrylate rubber, and styrene-butadiene rubber, from the viewpoints of mechanical characteristic and surface appearance.

The monomer component co-polymerizable by grafting with the rubber component is exemplified by aromatic vinyl compound; vinyl cyanide compound; (meth)acrylate ester compound; (meth)acrylic acid compound; epoxy group-containing (meth)acrylate ester compound such as glycidyl (meth)acrylate; maleimide compound such as maleimide, N-methyl maleimide, and N-phenyl maleimide; and α,β-unsaturated carboxylic acid compound such as maleic acid, phthalic acid and itaconic acid, and anhydride of them (maleic anhydride, for example). These monomer components may be used singly, or in the form of mixture of two or more kinds. Among them, aromatic vinyl compound, vinyl cyanide compound, (meth)acrylate ester compound, and (meth)acrylic acid compound are preferred from the viewpoints of mechanical properties and surface appearance, and (meth)acrylate ester compound is more preferred. The (meth)acrylate ester compound is specifically exemplified by methyl (meth)acrylate, ethyl (meth)acrylate, butyl (meth)acrylate, cyclohexyl (meth)acrylate, and octyl (meth) acrylate.

The graft copolymer copolymerized with the rubber component is preferably core/shell-type graft copolymer, from the viewpoints of impact resistance and surface appearance. Among others, particularly preferred is core/shell-type graft copolymer having a core layer that contains at least one rubber component selected from polybutadiene-containing rubber, polybutyl acrylate-containing rubber, polyorganosiloxane rubber, and IPN-type composite rubber composed of polyorganosiloxane rubber and polyalkyl acrylate rubber; and a shell layer formed around it by copolymerizing (meth)acrylate ester. The core/shell-type graft copolymer is preferably any of those in which the rubber component (preferably butadiene rubber) accounts for 40% by mass or more (and preferably 90% by mass or less), and more preferably accounts for 60% by mass or more (and preferably 85% by mass or less). The core/shell-type graft copolymer is also preferably any of those in which the (meth) acrylic acid accounts for 10% by mass or more (and preferably 60% by mass or less), and more preferably accounts for 15% by mass or more (and preferably 40% by mass or less). Note, the core/shell-type in this context is not always necessarily that the core layer and the shell layer are clearly discriminable, instead widely encompasses any compound obtainable by grafting the rubber component around a part that serves as the core.

Preferred core/shell-type graft copolymer is specifically exemplified by butadiene-methyl acrylate copolymer, methyl methacrylate-butadiene-styrene copolymer, methyl methacrylate-butadiene copolymer, methyl methacrylate-acryl/butadiene rubber copolymer, methyl methacrylate-acryl/butadiene rubber-styrene copolymer, and methyl methacrylate-(acryl/silicone IPN rubber) copolymer. These rubber-like polymers may be used singly, or in the form of mixture of two or more kinds.

The content of the impact modifier, when contained in the resin composition of this invention, is preferably 2 parts by mass or more per 100 parts by mass in total of the polycarbonate resin, more preferably 4 parts by mass or more, and even more preferably 6 parts by mass or more. With the content of the impact modifier controlled to 2 parts by mass or more, the impact resistance tends to further improve. Meanwhile, the content of the impact modifier is preferably 20 parts by mass or less per 100 parts by mass in total of the polycarbonate resin, more preferably 18 parts by mass or less, and even more preferably 15 parts by mass or less. With the content of the impact modifier controlled to 20 parts by mass or less, the fluidity tends to further improve.

Only one kind of the impact modifier may be contained, or two or more kinds may be contained. When two or more kinds are contained, the total content preferably falls within any of the aforementioned ranges.

«Heat Stabilizer»

For the heat stabilizer, phosphorus-containing stabilizer is preferably used.

Any of known phosphorus-containing stabilizers may be used. Specific examples include oxoacids of phosphorus such as phosphoric acid, phosphoric acid, phosphorous acid, phosphinic acid, and polyphosphoric acid; metal acid pyrophosphates such as sodium acid pyrophosphate, potassium acid pyrophosphate, and calcium acid pyrophosphate; phosphates of Group I or Group IIB metal such as potassium phosphate, sodium phosphate, cesium phosphate, and zinc phosphate; organophosphate compound, organophosphite compound, and organophosphonite compound, wherein organophosphite compound is particularly preferred.

The organophosphite compound is exemplified by triphenyl phosphite, tris(mononoylphenyl) phosphite, tris (mononyl/dinonylphenyl) phosphite, tris(2,4-di-tert-butylphenyl) phosphite, monooctyldiphenyl phosphite, dioctylmonophenyl phosphite, monodecyldiphenyl phosphite, didecylmonophenyl phosphite, tridecyl phosphite, trilauryl phosphite, tristearyl phosphite, and 2,2-methylenebis (4,6-di-tert-butylphenyl)octyl phosphite.

Such organophosphite compound is specifically exemplified by "ADK STAB (registered trademark, the same shall apply hereinafter) 1178", "ADK STAB 2112", "ADK STAB HP-10", "AX-71" from ADEKA Corporation; "JP-351", "JP-360", and "JP-3CP" from Johoku Chemical Co., Ltd.; and "Irgafos (registered trademark, the same shall apply hereinafter) 168" from BASF SE.

The content of the heat stabilizer in the resin composition of this invention, per 100 parts by mass of the polycarbonate resin, is usually 0.001 parts by mass or more, preferably 0.005 parts by mass or more, and more preferably 0.01 parts by mass or more; meanwhile usually 1 part by mass or less, preferably 0.5 parts by mass or less, and more preferably 0.3 parts by mass or less. With the content of the heat stabilizer controlled within any of these ranges, the effect of addition of the heat stabilizer will be more efficiently demonstrated.

The resin composition of this invention may contain only one kind of the heat stabilizer, or may contain two or more kinds. In a case where two or more kinds are contained, the total content preferably falls within any of the aforementioned ranges.

«Antioxidant»

For the antioxidant, phenol-based antioxidant is preferred, and hindered phenol-based antioxidant is more preferred.

Specific examples of the hindered phenol-based antioxidant include pentaerythritoltetrakis[3-(3,5-di-tert-butyl-4-hydroxyphenyl) propionate], octadecyl-3-(3,5-di-tert-butyl-4-hydroxyphenyl) propionate, thiodiethylene bis[3-(3,5-di-tert-butyl-4-hydroxyphenyl) propionate], N,N'-hexane-1,6-diylbis[3-(3,5-di-tert-butyl-4-hydroxyphenyl) propionamide], 2,4-dimethyl-6-(1-methylpentadecyl) phenol, diethyl[[3,5-bis(1,1-dimethylethyl)-4-hydroxyphenyl]methyl] phosphate, 3,3',3'',5,5',5''-hexa-tert-butyl-a,a',a''-(mesitylene-2,4,6-triyl)tri-p-cresol, 4,6-bis (octylthiomethyl)-o-cresol, ethylene bis(oxyethylene)bis[3-(5-tert-butyl-4-hydroxy-m-tolyl) propionate], hexamethylenebis[3-(3,5-di-tert-butyl-4-hydroxyphenyl) propionate], 1,3,5-tris(3,5-di-tert-butyl-4-hydroxybenzyl)-1,3,5-triazine-2,4,6(1H,3H,5H)-trione, 2,6-di-tert-butyl-4-(4, 6-bis(octylthio)-1,3,5-triazine-2-ylamino)phenol, and 2-[1-(2-hydroxy-3,5-di-tert-pentylphenyl)ethyl]-4,6-di-tert-pentylphenyl acrylate.

Among them, pentaerythritoltetrakis[3-(3,5-di-tert-butyl-4-hydroxyphenyl) propionate], and octadecyl-3-(3,5-di-tert-butyl-4-hydroxyphenyl) propionate are preferred. Such hindered phenol-based stabilizer is specifically exemplified by "Irganox (registered tradename, the same shall apply hereinafter) 1010" and "Irganox 1076" from BASF SE; and "ADK STAB AO-50" and "ADK STAB AO-60" from ADEKA Corporation.

The content of the antioxidant in the resin composition of this invention, per 100 parts by mass of the polycarbonate resin, is usually 0.001 parts by mass or more, preferably 0.005 parts by mass or more, more preferably 0.01 parts by mass or more; meanwhile usually 1 part by mass or less, preferably 0.5 parts by mass or less, and more preferably 0.4 parts by mass or less. With the content of the antioxidant controlled within any of these ranges, an effect of addition of the antioxidant will be more efficiently demonstrated.

The resin composition of this invention may contain only one kind of antioxidant, or may contain two or more kinds. In a case where two or more kinds are contained, the total content preferably falls within any of the aforementioned ranges.

«Mold Releasing Agent»

The mold releasing agent is exemplified by aliphatic carboxylic acid, ester formed between aliphatic carboxylic acid and alcohol, aliphatic hydrocarbon compound having a number-average molecular weight of 200 to 15,000, and polysiloxane-based silicone oil.

The aliphatic carboxylic acid is exemplified by saturated or unsaturated, monovalent, divalent, or trivalent aliphatic carboxylic acids. Now the aliphatic carboxylic acids encompass alicyclic carboxylic acid. Among them, the aliphatic carboxylic acid is preferably monovalent or divalent carboxylic acid having 6 to 36 carbon atoms, and more preferably saturated aliphatic monovalent carboxylic acid having 6 to 36 carbon atoms. Such aliphatic carboxylic acid is specifically exemplified by palmitic acid, stearic acid, caproic acid, capric acid, lauric acid, arachic acid, behenic acid, lignoceric acid, cerotic acid, melissic acid, tetratriacontanoic acid, montanoic acid, adipic acid, and azelaic acid.

The aliphatic carboxylic acid in the ester formed between aliphatic carboxylic acid and alcohol, employable here, may be same as the aforementioned aliphatic carboxylic acid. Meanwhile, the alcohol is exemplified by saturated or unsaturated, monohydric, or polyhydric alcohols. These alcohols may have a substituent such as fluorine atom or aryl group. Among them, monohydric or polyhydric saturated alcohol having 30 or less carbon atoms is preferred, and saturated aliphatic monohydric alcohol or saturated aliphatic polyhydric alcohol having 30 or less carbon atoms is more preferred. Now, "aliphatic" encompass "alicyclic".

Such alcohol is specifically exemplified by octanol, decanol, dodecanol, stearyl alcohol, behenyl alcohol, ethylene glycol, diethylene glycol, glycerin, pentaerythritol, 2,2-dihydroxyperfluoropropanol, neopentylene glycol, ditrimethylolpropane, and dipentaerythritol.

Note that the ester may contain aliphatic carboxylic acid and/or alcohol as an impurity. The ester may be a pure substance, or may be a mixture of a plurality of compounds. Each of the aliphatic carboxylic acid and the alcohol that combine to form one ester may be used singly, or may be used while freely combining two or more kinds according to freely selectable ratio.

Specific examples of the ester formed between the aliphatic carboxylic acid and the alcohol include, beeswax (mixture mainly composed of myricyl palmitate), stearyl stearate, behenyl behenate, stearyl behenate, glycerin monopalminate, glycerin monostearate, glycerin distearate, glycerin tristarate, pentaerythritol monopalminate, pentaerythritol monostearate, pentaerythritol distearate, pentaerythritol tristearate, and pentaerythritol tetrastearate.

Besides the aforementioned compounds, ester compounds described in paragraphs [0029] to [0073] of WO2019/078162 are applicable to the mold releasing agent, the contents of which are incorporated by reference into this patent specification.

The content of the mold releasing agent in the resin composition of this invention, per 100 parts by mass in total of the polycarbonate resin ingredient and optional other resin ingredient, is usually 0.001 parts by mass or more, and preferably 0.01 parts by mass or more; meanwhile usually 2 parts by mass or less, preferably 1 part by mass or less, and more preferably 0.8 parts by mass or less. With the content of the mold releasing agent controlled to any of the lower limit values of the aforementioned ranges or above, the effect of mold releasing agent will be more effectively demonstrated, meanwhile with the content controlled to any of the upper limit values of the aforementioned ranges or below, lowering of the hydrolysis resistance, contamination of dies during injection molding and so forth may be more effectively suppressed. Although highly transparent molded article is obtainable irrespective of the content of the mold releasing agent, the hardness and heat resistance will tend to further improve, by controlling the content not higher than the upper limit values of the aforementioned ranges.

Only one kind of the mold releasing agent may be contained, or two or more kinds may be contained. In a case where two or more kinds are contained, the total content preferably falls within any of the aforementioned ranges.

«UV Absorber»

Regarding the UV absorber, descriptions in paragraphs [0059] to [0062] of JP-2016-216534A may be referred to, the contents of which are incorporated by reference into this patent specification.

«Antistatic Agent»

Regarding the antistatic agent, descriptions in paragraphs [0063] to [0067] of JP-2016-216534A may be referred to, the contents of which are incorporated by reference into this patent specification.

«Flame Retardant»

Regarding the flame retardant, descriptions in paragraphs [0068] to [0075] of JP-2016-216534A may be referred to, the contents of which are incorporated by reference into this patent specification.

<Characteristics of Resin Composition>

Next, preferred characteristics of the resin composition of this invention will be explained.

The resin composition of this invention may demonstrate a pencil hardness of "H" or larger, when formed into a flat plate and measured in compliance with JIS K5600, wherein the pencil hardness may be 2H or larger, and may even be 3H or larger. The upper limit of the pencil hardness, although not specifically limited, may typically be 4H or below, which is enough to satisfy required performances. In this invention, with use of the polycarbonate resin that contains the structural unit represented by formula (1), the scratch resistance may be improved.

The resin composition of this invention may demonstrate a loss tangent of 0.0200 or smaller, when formed into a flat plate and measured at a frequency of 2.45 GHz, wherein the loss tangent may be 0.0150 or smaller, and even may be 0.010 or smaller. The lower limit value of the loss tangent at a frequency of 2.45 GHz, although not specifically limited, is practically 0.0010 or above. With use of the polycarbonate resin that contains the structural unit represented by formula (1) in this invention, the loss tangent may be lowered.

The resin composition of this invention may have a flexural modulus of 2500 MPa or larger when formed into an ISO multi-purpose test specimen (4 mm thick), which may even be 3000 MPa or larger. The upper limit value of the flexural modulus is practically 13000 MPa or below.

The resin composition of this invention may have a flexural strength of 80 MPa or larger when formed into an ISO multi-purpose test specimen (4 mm thick), which may even be 90 MPa or larger. The upper limit value of the flexural strength is practically 200 MPa or below.

<Method for Manufacturing Resin Composition>

A wide variety of known methods are applicable to manufacture the resin composition of this invention, without special limitation, by which the polycarbonate resin, and the optionally added other ingredients are preliminarily mixed typically by using a variety of mixers such as tumbler or Henschel mixer, and then melt-kneaded by using a mixer such as banbury mixer, roll mixer, Brabender mixer, single-screw kneader/extruder, twin-screw kneader/extruder, or kneader.

Temperature of melt kneading is usually in the range from 240 to 320° C., although not specifically limited thereto.

<Molded Article>

The aforementioned resin composition (pellet, for example) is formed by any of various forming methods into the molded article. That is, the molded article of this invention is formed of the resin composition of this invention.

Shape of the molded article is properly selectable, without special limitation, depending on applications and purposes of the molded article, typically from film-like, cylindrical rod-like, annular, circular, elliptic, polygonal, shape-modified, hollow, frame-like, box-like, panel-like, and button-like shapes. Among them, film-like, frame-like, panel-like, or button-like shape is preferred. For the frame-like or the panel-like shape, the thickness is typically around 1 mm to 5 mm.

Method for forming the molded article may employ, without special limitation, any of known methods of forming that are exemplified by injection molding, injection compression molding, extrusion molding, profile extrusion, transfer molding, hollow molding, gas-assisted molding, blow molding, extrusion blow molding, IMC (in-molding coating), rotational molding, multi-layer molding, two-color molding, insert molding, sandwich molding, foam molding, and pressure molding. The resin composition of this invention is particularly suitable for the molded article obtainable by injection molding, injection compression molding, or extrusion molding. Of course, the resin composition of this invention is not limited to the molded article obtainable by these methods.

The resin composition of this invention is applicable to the electronic/electric equipment component used with an electromagnetic wave at a frequency of 1 GHz or higher. The electromagnetic wave at a frequency of 1 GHz or higher may transmit through at least a part of the electronic/electric equipment component. Now, the electronic/electric equipment component of this invention is applicable over a wide frequency band at 1 GHz or higher, and is usually applicable to a frequency band from 1 to 20 GHz, particularly from 1 to 10 GHz, and preferably from 1 to 3 GHz.

More specifically, the electronic/electric equipment component of this invention includes enclosure of electronic/electric equipment; circuit board; interlayer insulating film for semiconductor device; antenna component; insulating parts; insulating material for high-frequency coaxial cable; base components such as resistor, switch, capacitor, and photosensor; IC socket and connector; transportation equipment such as automobile, bicycle, motorcycle, truck, railway vehicle, helicopter, and aircraft; construction machines such as bulldozer, hydraulic shovel, and crane; vessels such as merchant ship, special purpose ship, fishing vessel, and naval vessel; agricultural machines such as tractor, and harvester; and mechanical parts of mobile phone, tablet computer, wearable device, computer, television set, VR goggles, camera, loudspeaker, drone, robot, sensor, medical instrument, and analytical instrument, and is particularly preferably applicable to enclosure of electronic/electric equipment.

The molded article obtainable by molding the resin composition of this invention is preferably used as a molded article having a plating on the surface thereof (plated molded article). The plating on the molded article of this invention is preferably embodied as having antenna performance.

<Method for Manufacturing Plated Molded Article>

The following description will disclose a method for manufacturing the plated molded article, including forming a plating by irradiating a surface of the molded article formed of the resin composition of this invention, with a laser, and then by applying a metal.

FIG. 1 is a schematic drawing illustrating a step of forming a plating layer on the surface of a molded article 1, by the laser direct structuring technology. The molded article 1, although illustrated in FIG. 1 as a flat substrate, is not always necessarily flat, and may partially or entirely be curved. The obtainable plated molded article is not always necessarily a final product, but may be any of various parts.

A first embodiment of the molded article involves a smooth surface. A prior process of forming the plating layer has involved rasping of the molded article formed of resin, so as to roughen the surface thereof in order to improve adhesiveness with the plating. In contrast, this invention can form the plating even on a smooth surface.

A second embodiment of the molded article involves an area to be plated which is not uniformly flat. More specifically, the molded article has projection and/or recess. This invention, adaptable to wide range of laser conditions, can properly form the plating even on the molded article whose area to be plated is not uniformly flat.

Referring again back to FIG. 1, laser 2 is irradiated on the molded article 1. The laser in this case is suitably selectable, without special limitation, from known lasers including YAG laser, excimer laser, and electromagnetic radiation, among which YAG laser is preferred. Also wavelength of the laser is not specifically limited, and preferably ranges from 200 nm to 1,200 nm, and more preferably from 800 to 1,200 nm.

Upon irradiated with the laser, the molded article 1 is activated only in an area 3 irradiated with the laser. With the irradiated area thus activated, the molded article 1 is then immersed in a plating solution 4. The plating solution 4 is selectable from a wide range of known plating solutions, without special limitation, such as those (particularly electroless plating solutions) containing as the metal ingredient at least one or more of copper, nickel, silver, gold or palladium; among which more preferred is plating solution (particularly electroless plating solution) containing at least one or more of copper, nickel, silver or gold; and further preferred is plating solution (particularly electroless plating solution) containing copper. That is, the plating in this invention preferably contains the metal ingredient which is composed of at least one of the aforementioned metals.

Also there is no special limitation on the method for applying the plating solution 4 to the molded article 1. An exemplary method is such as placing the molded article 1 into a liquid that contains the plating solution blended therewith. The molded article to which the plating solution was applied will have formed thereon a plating 5, only in the area where the laser light has been irradiated.

The method of this invention can form the plating (circuit pattern) having a pitch of 1 mm or narrower, which is even 150 μm or narrower (the lower limit is 30 μm or above, although not specifically limited). For the purpose of suppressing the thus formed plating from being corroded or degraded, the electroless plating may further be followed by protection with nickel or gold. Alternatively the electroless plating may be similarly followed by electroplating, thereby forming a necessary thickness of film within a short time.

The method for manufacturing the plated molded article is suitably used as a method for manufacturing a mobile electronic equipment component having an antenna, wherein the method contains the aforementioned method for manufacturing the plated molded article.

In addition, descriptions in JP 2011-219620 A, JP 2011-195820 A, JP 2011-178873 A, JP 2011-168705 A, and JP 2011-148267 A may be referred to, without departing from the spirit of this invention.

EXAMPLES

This invention will further be detailed referring to Examples. Materials, amounts of consumption, ratios, process details, process procedures and so forth described in Examples below may suitably be modified without departing from the spirit of this invention. The scope of this invention is therefore not limited to the specific Examples below.

1. Raw Materials

Materials listed in Table 1 below were used.

TABLE 1

| Material | Type |
| --- | --- |
| C-PC | 2,2-Bis-(4-hydroxy-3-methylphenyl)propane-type polycarbonate, synthesized according to Exemplary Synthesis described below, Mv = 18,000 |
| A-PC | Iupilon E-2000, from Mitsubishi Engineering-Plastics Corporation, 2,2-bis-(4-hydroxyphenyl)propane-type aromatic polycarbonate, Mv = 26,000 |
| LDS additive | Black 1G, copper chromium oxide, from The Shepherd Chemical Company |
| LDS additive | CP5CW, antimony-doped tin oxide, from Keeling & Walker Ltd. |
| LDS additive | 23-KT, aluminum-doped zinc oxide, from Hakusui Tech Co., Ltd., resistivity (product standard) = 100 to 500 Ω · cm |
| Glass fiber | T-187 from Nippon Electric Glass Co., Ltd., aspect ratio = 230, aspect ratio after compounding = 10 to 30 |
| Heat stabilizer | ADK STAB AX-71, from ADEKA Corporation |
| Antioxidant | ADK STAB AO-50, from ADEKA Corporation |
| Mold releasing agent | LOXIOL VPG861, from Cognis Japan Ltd. |
| Elastomer | Kane Ace M711, from Kaneka Corporation |

<Exemplary Synthesis of C-PC>

One hundred mol % of 2,2-bis(4-hydroxy-3-methylphenyl)propane, 103 mol % of diphenyl carbonate (DPC), and $1.5 \times 10^{-6}$ mol % of cesium carbonate as a catalyst were precisely weighed, to prepare a mixture. The mixture was then placed in a first reactor having an inner capacity of 200 L, and equipped with a stirrer, a heat medium jacket, a vacuum pump, and a reflux condenser.

Next, the inside of the first reactor was evacuated down to 1.33 kPa (10 Torr), and then returned to the atmospheric pressure with nitrogen. This cycle was repeated five times, to replace the inside of the first reactor with nitrogen. After the replacement with nitrogen, a heat medium at 230° C. was circulated through the heat medium jacket to gradually elevate the inner temperature of the first reactor, thereby melting the mixture. The stirrer was then rotated at 55 rpm, and the inner temperature of the first reactor was kept at 220° C., while controlling temperature in the heat medium jacket. The pressure in the first reactor was reduced from 101.3 kPa (760 Torr) down to 13.3 kPa (100 Torr) in terms of absolute pressure over 40 minutes, while distilling off phenol which is by-produced as a result of oligomerization between the aromatic dihydroxy compound and DPC, proceeded in the first reactor. Next, while keeping the pressure in the first reactor at 13.3 kPa and further distilling off the phenol, transesterification was allowed to proceed over 80 minutes.

The system pressure was then brought back to an absolute pressure of 101.3 kPa with nitrogen, elevated to a gauge pressure of 0.2 MPa, and the oligomer in the first reactor was pressure-fed through a transfer pipe preheated to 200° C. or higher to a second reactor. The second reactor has an inner volume of 200 L, equipped with a stirrer, a heat medium jacket, a vacuum pump, and a reflux condenser, with the inner pressure controlled to the atmospheric pressure, and with the inner temperature controlled to 240° C.

The oligomer having been pressure-fed into the second reactor was stirred at 16 rpm, the inner temperature was elevated with the aid of the heat medium jacket, and the inner pressure of the second reactor was reduced from 101.3 kPa to 13.3 kPa in terms of absolute pressure over 40 minutes. The temperature elevation was maintained thereafter, and the inner pressure was further reduced from 13.3 kPa to 399 Pa (3 Torr) in terms of absolute pressure over additional 40 minutes, while removing the distilled phenol out of the system. The temperature elevation was further continued, and the absolute pressure in the second reactor was kept at 70 Pa (ca. 0.5 Torr) upon arrival thereat and thereafter, thereby allowing the condensation polymerization to proceed. The final inner temperature in the second reactor was found to be 285° C. The condensation polymerization was terminated, upon arrival of the stirrer of the second reactor at a predetermined stirring power.

The inside of the second reactor was then brought back to an absolute pressure of 101.3 kPa with nitrogen, elevated to a gauge pressure of 0.2 MPa, and the aromatic polycarbonate resin was then drawn out in the fault of strand from the bottom of the second reactor, and pelletized with a rotary cutter while cooling the strand in a water bath.

The thus obtained pellet was blended with butyl p-toluenesulfonate whose molar quantity is four times that of cesium carbonate, the blend was fed to a twin-screw extruder, extruded through a die of the extruder into strand, and cut with the cutter, to obtain an aromatic polycarbonate resin (C-PC) in which the polymerization catalyst was inactivated.

<Measurement of Viscosity-Average Molecular Weight (Mv) of Polycarbonate Resins>

The viscosity-average molecular weight (Mv) of each polycarbonate resin was determined by finding the limiting viscosity ($\eta$) (in dL/g) at 20° C. in methylene chloride as a solvent, with use of an Ubbelohde viscometer, and calculated from the Schnell's viscosity equation below:

$$\eta = 1.23 \times 10^{-4} \, Mv^{0.83}$$

<Ratio of Formula (1) (Mass Ratio of Structural Unit Represented by Formula (1) in Polycarbonate Resin>

The mass ratio of the structural unit represented by formula (1) in the polycarbonate resin was calculated from the mixing ratio of resins, molecular weight of the molecule that composes the structural unit represented by formula (1), and the viscosity-average molecular weight.

2. Example 1 to Example 12, Comparative Example 1 to Comparative Example 6

<Manufacture of Resin Composition Pellet>

The individual ingredients listed in Table 1 above (excluding glass fiber) were blended according to ratios summarized in Table 2 or Table 3 below (all denoted in parts by mass), each mixture was uniformly mixed in a tumbler mixer for 20 minutes, fed into an extruder through a barrel provided on the upstream side of the extruder, by using a twin-screw extruder (TEM26SX, from Toshiba Machine Co., Ltd.) at a cylinder preset temperature of 280° C., a screw rotation speed of 250 rpm, and an ejection rate of 20 kg/hr, and melt-kneaded. The glass fiber was fed into the twin-screw extruder through a side feeder. After the melt-kneading, the molten resin composition was extruded into strand and rapidly cooled in a cooling water bath, pelletized with a pelletizer, to obtain pellet.

<Flexural Modulus and Flexural Strength>

The thus obtained pellet was dried at 100° C. for 5 hours, and injection-molded with use of an injection molding machine (NEX80) from Nissei Plastic Industrial Co., Ltd., at a cylinder temperature of 280° C., a die temperature of 80° C., and a molding cycle of 50 seconds, to manufacture an ISO multi-purpose test specimen (4 mm thick). The thus obtained test specimen was subjected to a flexure test in compliance with ISO 178 at room temperature (23° C.), to measure flexural modulus (in MPa) and flexural strength (in MPa).

<Loss Tangent>

The loss tangent of the 100 mm×1.5 mm×2 mm flat specimen made of each resin composition was measured by the perturbation method at a frequency of 2.45 GHz.

More specifically, the thus obtained pellet was preliminarily dried by using a hot air dryer at 100° C. for 6 hours, and extruded with use of an extruder (NEX80) from Nissei Plastic Industrial Co., Ltd., under conditions including a cylinder temperature of 280° C., a die temperature of 80° C., and a molding cycle of 50 seconds, to manufacture a 100 mm×100 mm×2 mm flat specimen. The 100 mm×1.5 mm×2 mm flat specimen was cut out from the flat specimen manufactured, and the loss tangent at a frequency of 2.45 GHz was measured by using a network analyzer from Keysight Technologies, Inc., and a cavity resonator from Kanto Electronic Application and Development, Inc.

Results are summarized in Table 2 or Table 3.

<Measurement of Pencil Hardness>

Pencil hardness of the thus obtained multi-purpose test specimen (4 mm thick) was measured in compliance with JIS K5600 by using a pencil hardness tester under 1 kg load.

The pencil hardness tester was a product of Toyo Seiki Seisaku-sho, Ltd.

Results are summarized in Table 2 or Table 3.

<Platability>

On a 10×10 mm area of the thus obtained multi-purpose test specimen (4 mm thick), laser was irradiated using a laser irradiation apparatus VMc1 from Trumpf (YAG laser of 1064 nm, maximum laser output=15 W), at an output power of 6 W or 8 W, a frequency of 60 kHz or 80 kHz, and a scanning speed of 4 m/s. The subsequent plating was carried out in an electroless plating bath ENPLATE LDS CU400PC from Enthone, at 48° C. The platability was determined as follows. Results are summarized in Table 2 or 3.

A: Plating formed.   B: Plating not formed.

TABLE 2

|  |  | Example 1 | Comparative Example 1 | Example 2 | Comparative Example 2 | Example 3 | Comparative Example 3 | Example 4 | Example 5 | Example 6 |
|---|---|---|---|---|---|---|---|---|---|---|
| Polycarbonate resin | C-PC | 39.2 |  | 37.7 |  | 38.2 |  | 31.0 | 33.6 | 36.7 |
|  | A-PC | 60.8 | 100.0 | 62.3 | 100.0 | 61.8 | 100.0 | 69.0 | 66.4 | 63.3 |
| Ratio of formula (1) (% by mass) |  | 39.2 | 0 | 37.7 | 0 | 38.2 | 0 | 31.0 | 33.6 | 36.7 |
| LDS Additive | Black1G | 10.5 | 10.5 |  |  |  |  |  |  |  |
|  | CP5CW |  |  | 6.3 | 6.3 | 1.3 | 1.3 |  |  |  |
|  | 23KT |  |  |  |  | 6.4 | 6.4 | 46.5 | 58.8 | 73.4 |
| Glass fiber | T-187 | 13.1 | 13.1 | 12.6 | 12.6 | 12.7 | 12.7 |  |  |  |
| Heat stabilizer | AX71 | 0.1 | 0.1 | 0.1 | 0.1 | 0.1 | 0.1 | 0.2 | 0.2 | 0.2 |
| Antioxidant | AO-50 | 0.1 | 0.1 | 0.1 | 0.1 | 0.1 | 0.1 | 0.2 | 0.2 | 0.2 |
| Mold releasing agent | VPG861 | 0.4 | 0.4 | 0.4 | 0.4 | 0.4 | 0.4 | 0.5 | 0.5 | 0.6 |
| Elastomer | M711 | 6.5 | 6.5 | 6.3 | 6.3 | 6.4 | 6.4 | 7.8 | 8.4 | 9.2 |
| Flexural modulus | MPa | 3998 | 3087 | 4012 | 4006 | 4114 | 4098 | 2905 | 3087 | 3299 |
| Flexural strength | MPa | 122.1 | 110.5 | 126.5 | 114.3 | 131.3 | 119.8 | 95 | 96.4 | 92.9 |
| Loss tangent | 2.45 GHz | 0.0052 | 0.0062 | 0.0048 | 0.0059 | 0.0053 | 0.0064 | 0.0066 | 0.0088 | 0.0130 |
| Pencil hardness |  | H | HB | H | HB | H | HB | F | F | F |
| Platability |  | A | A | A | A | A | A | A | A | A |
| Permittivity | 2.45 GHz | — | — | — | — | — | — | 4.1 | 4.5 | 5.3 |

TABLE 3

|  |  | Comparative Example 4 | Example 7 | Example 8 | Example 9 | Comparative Example 5 | Example 10 | Example 11 | Example 12 | Comparative Example 6 |
|---|---|---|---|---|---|---|---|---|---|---|
| Polycarbonate resin | C-PC |  | 36.7 | 40.4 | 44.9 |  | 44.9 | 50.6 | 58.0 |  |
|  | A-PC | 100.0 | 63.3 | 59.6 | 55.1 | 100.0 | 55.1 | 49.4 | 42.0 | 100.0 |
| Ratio of formula (1) (% by mass) |  | 0 | 36.7 | 40.4 | 44.9 | 0 | 44.9 | 50.6 | 58.0 | 0 |
| LDS Additive | Black1G |  |  |  |  |  |  |  |  |  |
|  | CP5CW |  |  |  |  |  |  |  |  |  |
|  | 23KT | 73.4 | 55.0 | 70.7 | 89.9 | 89.9 | 67.4 | 88.6 | 115.9 | 115.9 |
| Glass fiber | T-187 |  | 18.3 | 20.2 | 22.5 | 22.5 | 44.9 | 50.6 | 58.0 | 58.0 |
| Heat stabilizer | AX71 | 0.2 | 0.2 | 0.2 | 0.2 | 0.2 | 0.2 | 0.3 | 0.3 | 0.3 |
| Antioxidant | AO-50 | 0.2 | 0.2 | 0.2 | 0.2 | 0.2 | 0.2 | 0.3 | 0.3 | 0.3 |
| Mold releasing agent | VPG861 | 0.6 | 0.6 | 0.6 | 0.7 | 0.7 | 0.7 | 0.8 | 0.9 | 0.9 |
| Elastomer | M711 | 9.2 | 9.2 | 10.1 | 11.2 | 11.2 | 11.2 | 12.7 | 14.5 | 14.5 |
| Flexural modulus | MPa | 3227 | 4889 | 5314 | 5807 | 5880 | 7827 | 8573 | 9431 | 9492 |
| Flexural strength | MPa | 84.1 | 128.1 | 128.1 | 124.6 | 113.9 | 152.1 | 154.2 | 156.5 | 143.2 |
| Loss tangent | 2.45 GHz | 0.0144 | 0.0078 | 0.0103 | 0.0151 | 0.017 | 0.0085 | 0.0107 | 0.015 | 0.0178 |
| Pencil hardness |  | 2B | H | H | 2H | HB | 2H | 2H | 3H | F |
| Platability |  | A | A | A | A | A | A | A | A | A |
| Permittivity | 2.45 GHz | 5.4 | 4.5 | 5.2 | 6.0 | 6.4 | 5.1 | 5.8 | 6.8 | 7.2 |

In Table 2 and Table 3 above, ratio of formula (1) means the mass ratio (% by mass) of the structural unit represented by formula (1) in the polycarbonate resin contained in the resin composition.

As is clear from the results above, the resin compositions of this invention were found to be able to have a plating foamed thereon, and the loss tangent was successfully made low (Examples 1 to 12). Also, the pencil hardness was successfully made high. In contrast, the compositions of Comparative Examples were found to be able to have plating, but demonstrate high loss tangent (Comparative Examples 1 to 6). Also, the pencil hardness was found low.

REFERENCE SIGNS LIST 1 molded article
2 laser
3 laser-irradiated area
4 plating solution
5 plating

The invention claimed is:

1. A resin composition for laser direct structuring, comprising:
a polycarbonate resin; and
a laser direct structuring additive,
wherein the polycarbonate resin comprises 5% by mass or more, relative to all structural units, of a structural unit of formula (1),

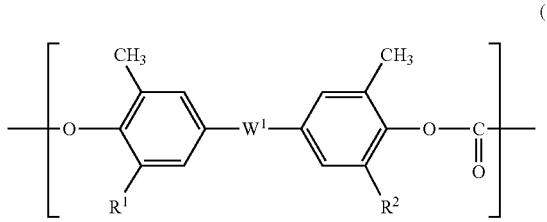

wherein $R^1$ and $R^2$ are each independently a hydrogen atom or a methyl group, and $W^1$ is a single bond or a divalent group, and
a content of the laser direct structuring additive, per 100 parts by mass of the polycarbonate resin, is 18 parts by mass or more and 150 parts by mass or less.

2. The resin composition of claim 1, further comprising 10 parts by mass or more and 100 parts by mass or less of an inorganic filler, per 100 parts by mass of the polycarbonate resin.

3. The resin composition of claim 2, wherein the mass ratio of the structural unit represented by formula (1) in the polycarbonate resin, per 100 parts by mass of the inorganic filler, is 150 parts by mass or more.

4. The resin composition of claim 2, wherein the inorganic filler comprises at least one selected from the group consisting of glass, talc, wollastonite, titanium oxide, and boron nitride.

5. The resin composition of claim 2, wherein the inorganic filler comprises a glass fiber.

6. The resin composition of claim 1, wherein the polycarbonate resin further comprises a structural unit represented by formula (5),

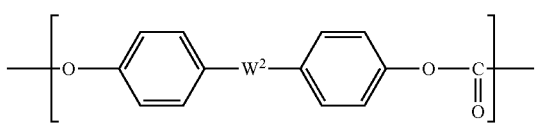

wherein $W^2$ represents a single bond or a divalent group.

7. The resin composition of claim 6, further comprising:
a polycarbonate resin (A1) in which the structural unit represented by formula (1) accounts for 90% by mass or more of all structural units, and
a polycarbonate resin (A2) in which the structural unit represented by formula (5) accounts for 90% by mass or more of all structural units,
wherein the polycarbonate resin (A1) accounts for 25% by mass or more of the polycarbonate resin contained in the resin composition.

8. The resin composition of claim 7, wherein the polycarbonate resin (A1) has a viscosity average molecular weight of 16,000 or larger and 30,000 or smaller, and the polycarbonate resin (A2) has a viscosity average molecular weight of 16,000 or larger and 35,000 or smaller.

9. The resin composition of claim 1, further comprising 2 parts by mass or more and 20 parts by mass or less of an impact modifier, per 100 parts by mass of the polycarbonate resin.

10. The resin composition of claim 1, wherein a pencil hardness is "H" or larger, when formed into a flat plate and measured in compliance with JIS K5600.

11. The resin composition of claim 1, wherein a loss tangent is 0.0200 or smaller, when the resin composition is formed into a flat plate and measured by perturbation at a frequency of 2.45 GHz employing a network analyzer and a cavity resonator.

12. The resin composition of claim 1, wherein the laser direct structuring additive comprises at least one selected from the group consisting of copper chromium oxide, oxide comprising at least either antimony or phosphorus together with tin, and conductive oxide comprising at least two kinds of metal and demonstrating a powder resistivity of $5\times10^3 \Omega \cdot cm$ or smaller, wherein the resistivity is measured when 10 g of a powder of the metal oxide is placed in a Teflon lined cylinder having an inner diameter of 25 mm at a packing ratio of 20%.

13. The resin composition of claim 1, wherein the laser direct structuring additive comprises a conductive oxide comprising at least two kinds of metal and demonstrating a resistivity of $5\times10^3 \Omega \cdot cm$ or smaller.

14. The resin composition of claim 1, wherein percentage of the structural unit represented by formula (1), relative to all structural units of the polycarbonate resin, is 30 to 60% by mass.

15. An electronic/electric equipment component comprising a molded component of the resin composition of claim 1, wherein the electronic/electric equipment is applied with an electromagnetic wave at a frequency of 1 GHz or higher.

16. A molded article formed of the resin composition of claim 1.

17. The molded article of claim 16, having a plating on a surface.

18. The molded article of claim 17, wherein the plating has antenna performance.

19. A method for manufacturing a plated molded article, the method comprising:
  forming a plating by irradiating a surface of a molded article described in claim 16, with a laser, and then applying a metal.

20. The resin composition of claim 1, wherein
  the resin composition contains 30 parts by mass or more and 150 parts by mass or less of the laser direct structuring additive, per 100 parts by mass of the polycarbonate resin.

* * * * *